(12) United States Patent
Wilder et al.

(10) Patent No.: US 12,744,537 B2
(45) Date of Patent: Sep. 22, 2026

(54) VOLTAGE-TO-FREQUENCY SWITCHING IMPLEMENTATION FOR INCREASED DATACENTER QUALITY

(71) Applicant: NVIDIA Corp., Santa Clara, CA (US)

(72) Inventors: Kevin Wilder, Wilmette, IL (US); Badarish Colathur Arvind, San Jose, CA (US); Jinal Shah, Foster City, CA (US)

(73) Assignee: Nvidia Corp., Santa Clara, CA (US)

( * ) Notice: Subject to any disclaimer, the term of this patent is extended or adjusted under 35 U.S.C. 154(b) by 82 days.

(21) Appl. No.: 18/991,505

(22) Filed: Dec. 21, 2024

(65) Prior Publication Data

US 2026/0180587 A1 Jun. 25, 2026

(51) Int. Cl.
*H03L 7/099* (2006.01)

(52) U.S. Cl.
CPC .................................... *H03L 7/099* (2013.01)

(58) Field of Classification Search
CPC ...................................................... H03L 7/099
See application file for complete search history.

(56) References Cited

U.S. PATENT DOCUMENTS

2018/0091291 A1* 3/2018 Haddad ................. H04L 7/0331
2021/0075434 A1* 3/2021 Bhatta ................. H03M 1/0626

* cited by examiner

*Primary Examiner* — Jeffrey M Shin
(74) *Attorney, Agent, or Firm* — Carnelian Law, LLC

(57) ABSTRACT

Voltage-Frequency domain switching circuits that include multiple stages each configured to receive a throttle code, each of the stages providing a fast-propagation path for the throttle code to a digitally controlled oscillator, and a frequency locked loop configured to (a) generate a code to the digitally controlled oscillator over a slow path, and (2) disable the fast path to the digitally controlled oscillator upon the code satisfying a match with the throttle code.

20 Claims, 7 Drawing Sheets

VOLTAGE-TO-FREQUENCY SWITCHING IMPLEMENTATION FOR INCREASED DATACENTER QUALITY

BACKGROUND

Voltage-to-Frequency (V-F) switching in an integrated circuit is a technique whereby the frequency of a periodic signal is adjusted to mitigate fluctuations in a voltage, for example a supply voltage of components of the integrated circuit. The relationship between the voltage setting and the corresponding frequency may be referred to as a "V-F curve".

The performance and power efficiency of different integrated circuits in a computer system may benefit from utilizing different V-F curves tailored to their function. For example, in a computer system utilized in a data center, the graphics processing units and the central processing units may be configured with different V-F curves to improve overall performance and reliability of the computer system.

Some systems may implement multiple V-F switching domains. The V-F switching domains may share a common full-swing voltage interval (VDD-VSS) but may comprise different maximum operating frequencies for the circuitry in those domains.

Different types of instructions executed by a data processor may have different utilization power profiles leading to different maximum frequencies at which the instructions may be executed. For example, in some data processors a half-matrix multiplication and accumulation instruction may comprise a different maximum clock frequency for execution than do other matrix multiply and accumulate instructions. It may therefore be advantageous to group instructions into different V-F curve domains.

Some conventional approaches to V-F switching may require increased post-silicon characterization and pessimistic feature productization margins due to their complexity. These complications may be amplified as the number of V-F switching domains of an integrated circuit increases.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Disclosed herein are robust V-F switching mechanisms that reduce transient performance loss and may decrease post-silicon characterization time for integrated circuits. The disclosed mechanisms may be resilient at V-F process corners and may scale to greater numbers of V-F switching domains without a commensurate increase in integrated circuit area.

Exemplary circuits may described herein in terms of 'positive logic', meaning that signals are described as 'asserted' in a high digital state (e.g., digital '1'), and de-asserted in a low digital state (e.g., digital '0'). Circuits utilizing 'negative logic' (de-asserted as '1' or asserted as '0') or combinations of positive and negative logic may also be readily utilized to implement the disclosed mechanisms.

Figure 1:
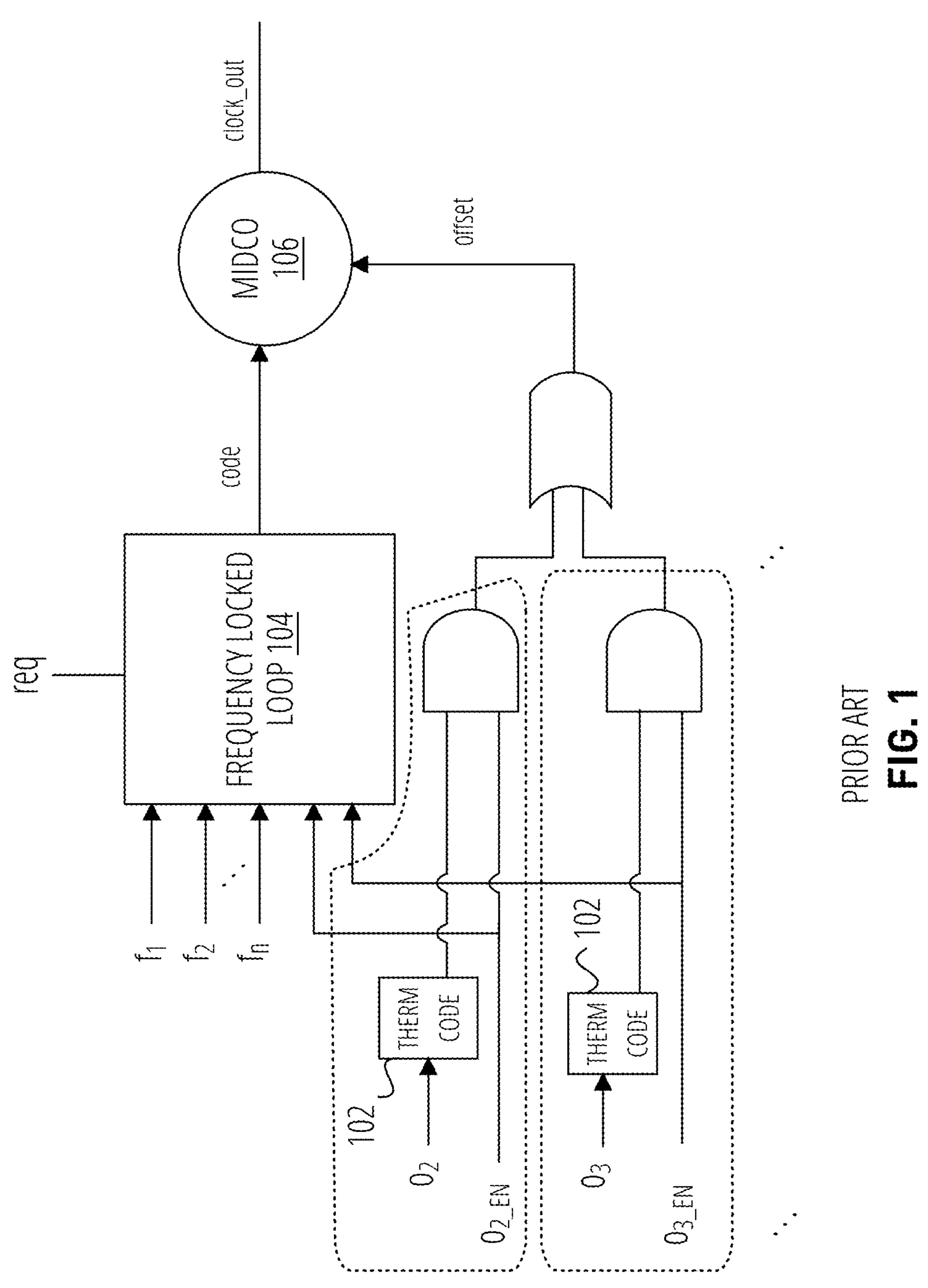
FIG. 1 and FIG. 2 depict aspects of a conventional V-F switching circuit.
Figure 2:
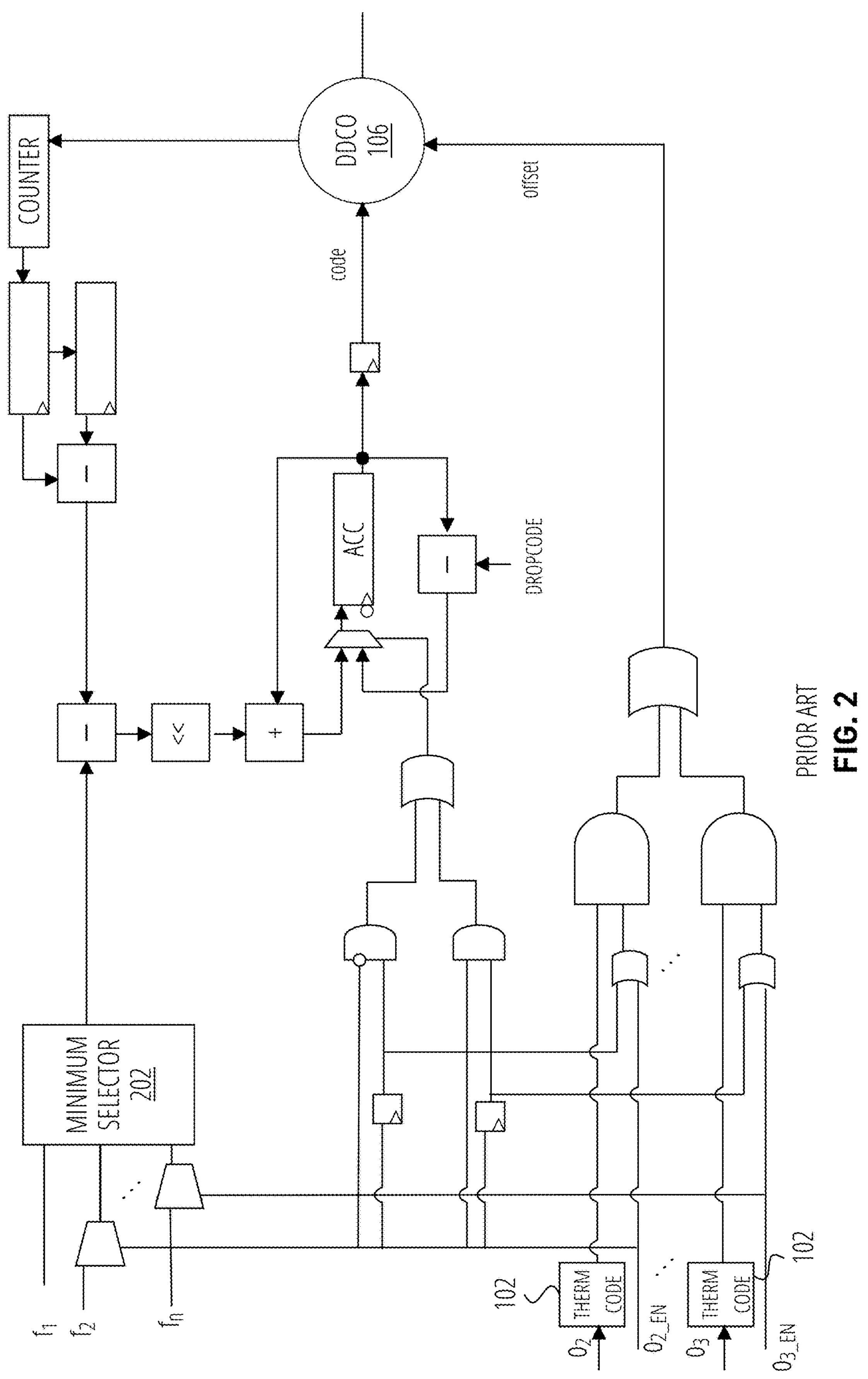

FIG. 1 and FIG. 2 depict aspects of a conventional V-F switching circuit. The circuit comprises a plurality of offset-generation stages (dotted lines) each comprising a thermometer decoder 102 and some combinatorial gates. The circuit further comprises a frequency locked loop 104 and a multiple-input digitally-controlled oscillator 106. The V-F switching circuit may be utilized to respond quickly to transient changes in load voltage, current, or induced noise in an integrated circuit.

A Multiple Input Digitally-Controlled Oscillator (MIDCO) circuit 106 is a type of oscillator for which the output frequency is controllable using multiple digital inputs. Unlike dynamically-controllable oscillators that utilize a single-ended input voltage such as Voltage-Controlled Oscillators (VCOs) and Digitally-Controlled Oscillators (DCOs), MIDCos utilize (at least) a pair of digital inputs to improve noise rejection and enhance stability and linearity. Internally, a MIDCO may be implemented utilizing a Digitally Controlled Oscillator (DCO), a Differential Voltage-Controlled Oscillator (DVCO), and/or a Voltage Controlled Oscillator (VCO) in some embodiments.

The V-F switching circuit may be configured to receive multiple V-F switching domain signals $f_1$, $f_2$, etc. These are depicted in FIG. 1 as discrete inputs, one or more of which may be selected at a time by operating a switch (not depicted) internal to the frequency locked loop 104. Alternatively an external switch may be utilized. The frequency locked loop 104 may comprise a minimum selector 202 that propagates the lowest input to its output. The minimum selector 202 may be implemented in manners known in the art.

The frequency locked loop 104 may comprise various logic that is depicted in FIG. 2 with familiar functional symbols such as subtraction circuits ("−"), addition circuits ("+"), accumulators (ACC), flops (boxes comprising a triangular clock input), muxes (truncated triangle), shift circuits ("<<"), and so on.

One of the V-F switching domain signals (e.g., $f_1$) may be a default setting to apply when none of the operation- or instruction-specific V-F switching domains ($f_2$, $f_3$ . . . ) are activated. The req input operates as a selection signal for the V-F switching domain signal(s) to apply to the frequency locked loop 104 at a given point during operation of the integrated circuit.

The settling time of output code of the frequency locked loop 104 in response to a switch to a different V-F switching domain may be unacceptably long. The control signal code thus arrives at the multiple-input digitally-controlled oscillator 106 over a 'slow-propagation path'. To provide a faster response time to a V-F switch, offset codes $O_2$, $O_3$, . . . that effectuate the throttle to output clock signal CLOCK_OUT may be enabled (via signals $O_{1\_EN}$, $O_{2\_EN}$ . . . ). The offset codes propagate more quickly (over a 'fast-propagation path', i.e., over a path with lower propagation delay) than the time it takes to generate and apply code to the multiple-input digitally-controlled oscillator 106. The offset codes are converted to thermometer codes that are applied directly to the multiple-input digitally-controlled oscillator 106 through low-latency combinatorial logic (e.g., AND and OR gates).

During a transition back to a non-throttled frequency, e.g., $f_2 \rightarrow f_1$, the frequency locked loop 104 output frequency drops by DROPCODE, offset $O_2$ is disabled, and the frequency locked loop 104 transitions back to a lock on the default (un-throttled) frequency $f_1$. The signal $O_2$ is asserted throughout the duration of slow-down to $f_2$, thus requiring the application of DROPCODE to prevent frequency overshoot during the reverse transition $f_1 \rightarrow f_2$. The storage of a DROPCODE incurs additional area on the integrated circuit for each V-F switching domain that is implemented, and the utilization of DROPCODEs may also incur the need for greater timing margins and performance loss.

Due to the combination of the frequency locked loop 104 code and the offset code at the multiple-input digitally-controlled oscillator 106, the conventional V-F switching circuit depicted in FIG. 1 may generate dithering in CLOCK_OUT. The offset codes to apply for particular V-F switching domains may be difficult to characterize, configure, and time properly relative to frequency locked loop 104 output code. Characterization and margining of the circuit in FIG. 1 may also be complicated by cumulative margining. For example, a transition from V-F switching state A to V-F switching state C and from V-F switching state B to V-F switching state C might need to be characterized and margined for the worst of both. In other words, V-F switching state A→V-F switching state B would need a design margin, and V-F switching state B→V-F switching state C might require margin on top of A→B's margin.

Figure 3:
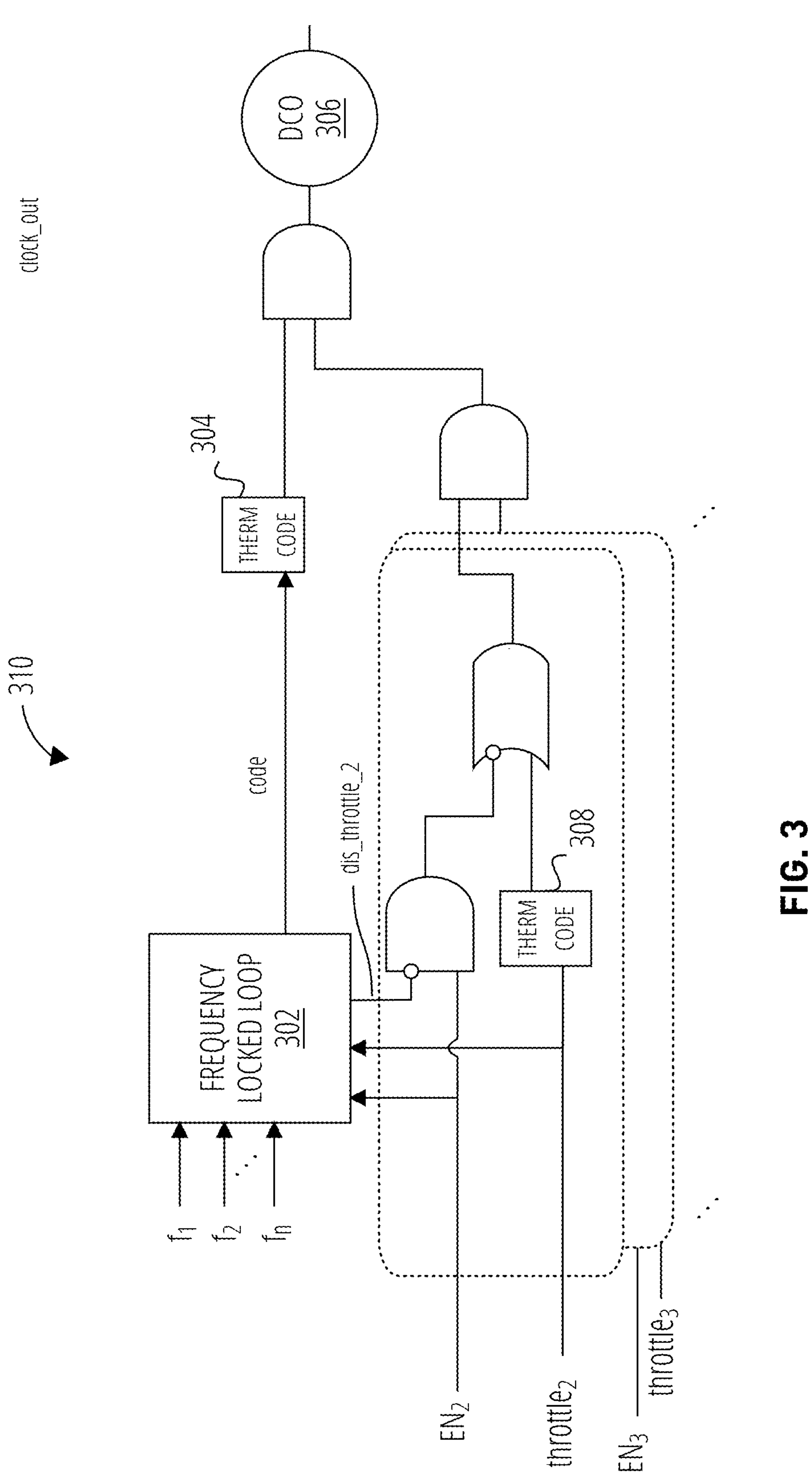
FIG. 3 and FIG. 4 depict aspects of an embodiment of a V-F switching circuit.
Figure 4:
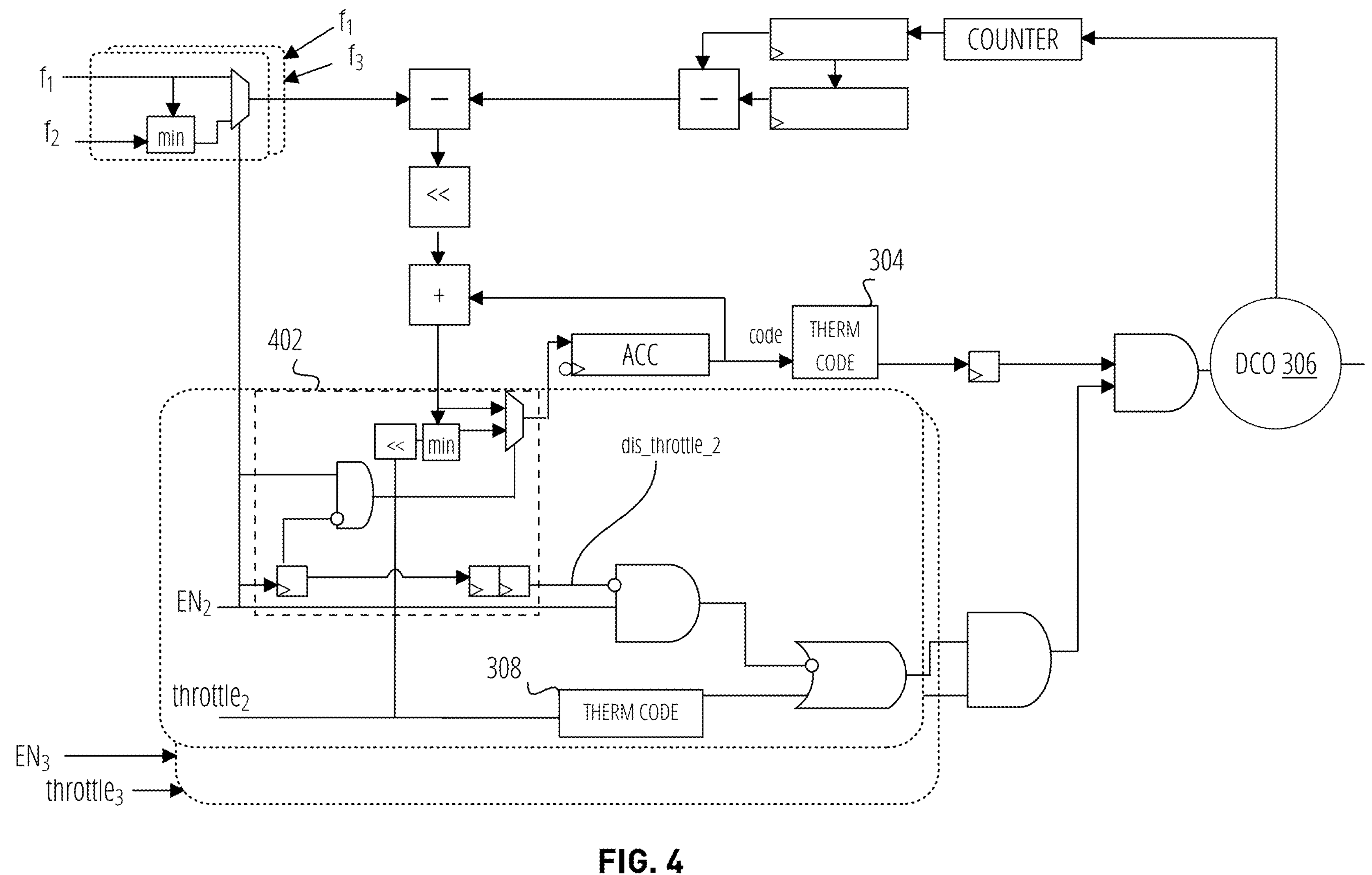

FIG. 3 and FIG. 4 depict aspects of an embodiment of a V-F switching circuit 310 that may exhibit decreased dithering, improved scalability, and/or decrease characterization effort over the conventional mechanism depicted in FIG. 1 and FIG. 2. The V-F switching circuit 310 comprises a frequency locked loop 302 that applies a code to a thermometer decoder 304 that in turn sets the output clock CLOCK_OUT of a digitally controlled oscillator 306. A stage comprising a thermometer decoder 308 is provided for each of the V-F switching domains ($f_2 \ldots f_n$) of an integrated circuit for which clock throttling may be applied.

The frequency locked loop 302 differs from the conventional design depicted in FIG. 2 in some aspects, and may comprise various logic that is depicted in FIG. 2 with familiar functional symbols such as subtraction circuits ("−"), addition circuits ("+"), accumulators (ACC), flops (boxes comprising a triangular clock input), muxes (truncated triangle), shift circuits ("<<"), minimum selectors ("min"), and so on.

Unlike the frequency locked loop 104 in the conventional mechanism, the frequency locked loop 302 obviates use of a DROPCODE and auto-adjusts to changes in the selected V-F switching domain via the action of regulator 402. The obviation of DROPCODEs saves area as the number of V-F switching domains is increased, and unlike conventional mechanisms margining for different V-F switching states need not be cumulative. The throttle values applied at the various stages correspond to actual CLOCK_OUT values of the digitally controlled oscillator 306, not offset amounts to be applied to output codes of the frequency locked loop 302. In other words, the throttle code and the code each comprise complete output settings for the digitally controlled oscillator, not partial settings (e.g., offsets).

As part of a switch between V-F switching domains (e.g., $f_1 \rightarrow f_2$), the target domain is enabled (e.g., $EN_2$) and a throttle code corresponding to the target V-F switching domain (e.g., $throttle_2$) is applied directly via low-latency combinatorial logic to the digitally controlled oscillator 306, as opposed to subtracting the frequency locked loop 104 code from an offset value as in the conventional mechanism.

Upon assertion of $EN_2$, the $throttle_2$ code is rapidly applied to the digitally controlled oscillator 306 to effectuate a throttling of CLOCK_OUT. The frequency locked loop 302 reacts to EN2 by reducing its output code to the setting of throttle2 at which point the frequency locked loop 302 asserts dis_throttle_2, removing the application of throttle2 from the digitally controlled oscillator 306 and restoring control over CLOCK_OUT to the frequency locked loop 302.

The stages each comprise a fast-propagation path for the throttle code to the digitally controlled oscillator 306, and the frequency locked loop 302 is configured to generate code to the digitally controlled oscillator 306 over a slow path and to disable the fast path to the digitally controlled oscillator 306 upon the code satisfying a match condition with the throttle code.

Figure 5:
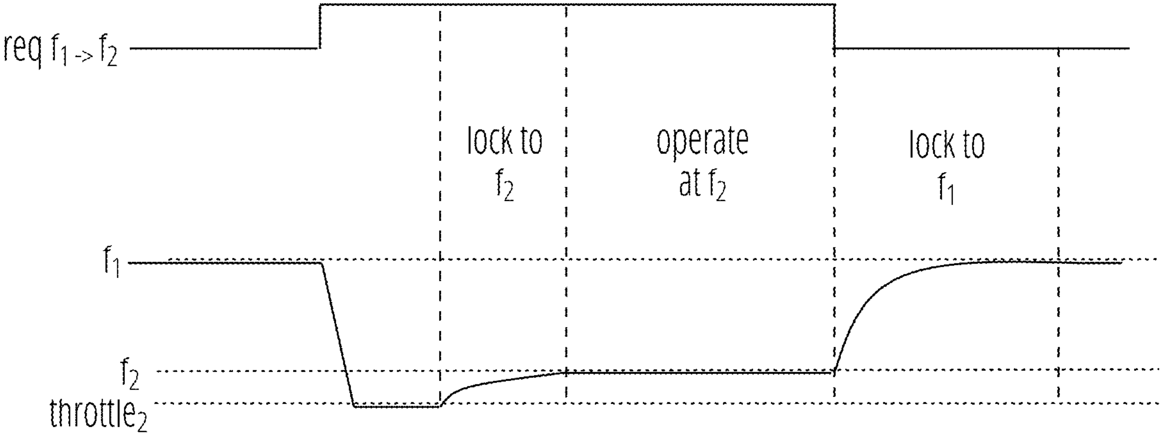
FIG. 5 depicts an example of transitions to and from a throttled V-F switching domain.

Referring to the example depicted in FIG. 5, once the throttle code is applied to the digitally controlled oscillator 306, control returns via the regulator 402 of the frequency locked loop 302 and the frequency locked loop 302 locks to the throttled target frequency (e.g., $f_2$). The application of an offset value as in the conventional mechanism is obviated. During a switch back from a throttled V-F switching domain to the default V-F switching domain (e.g., $f_2 \rightarrow f_1$), the frequency locked loop 302 converges to a lock from its current output frequency back to the default frequency.

Figure 6:
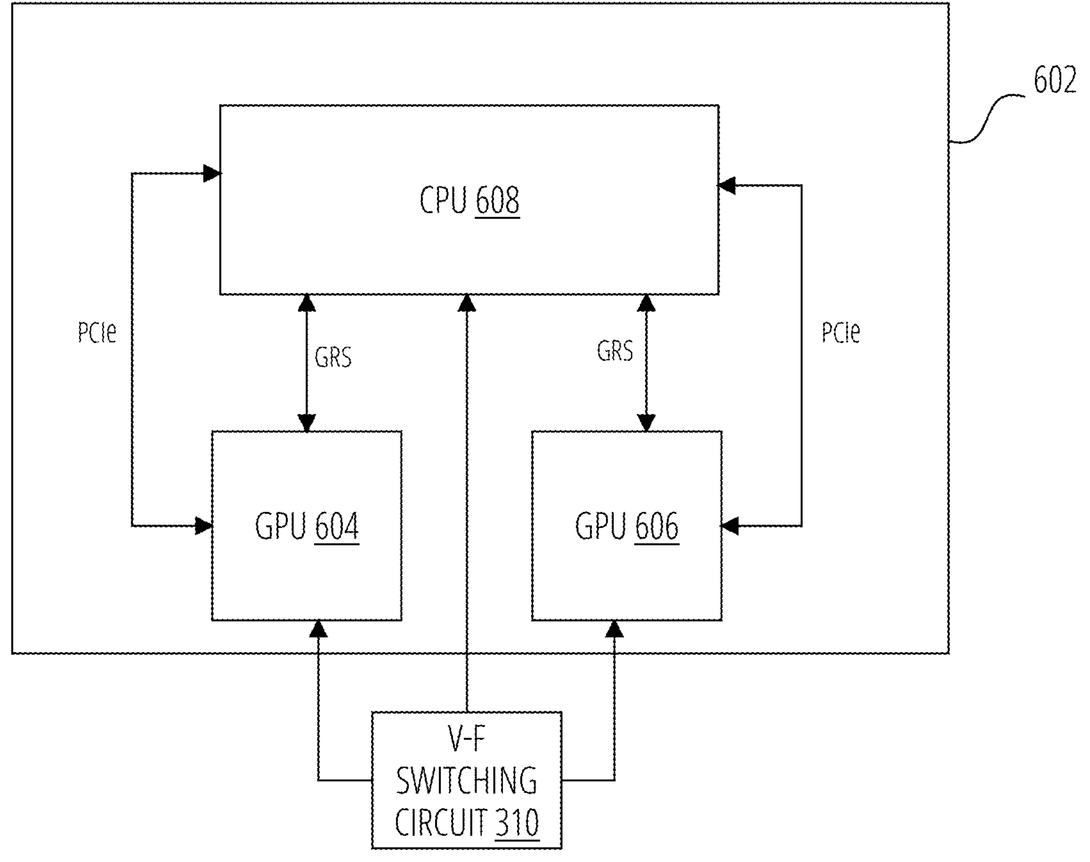
FIG. 6 depicts an integrated circuit in accordance with one embodiment.
Figure 7:
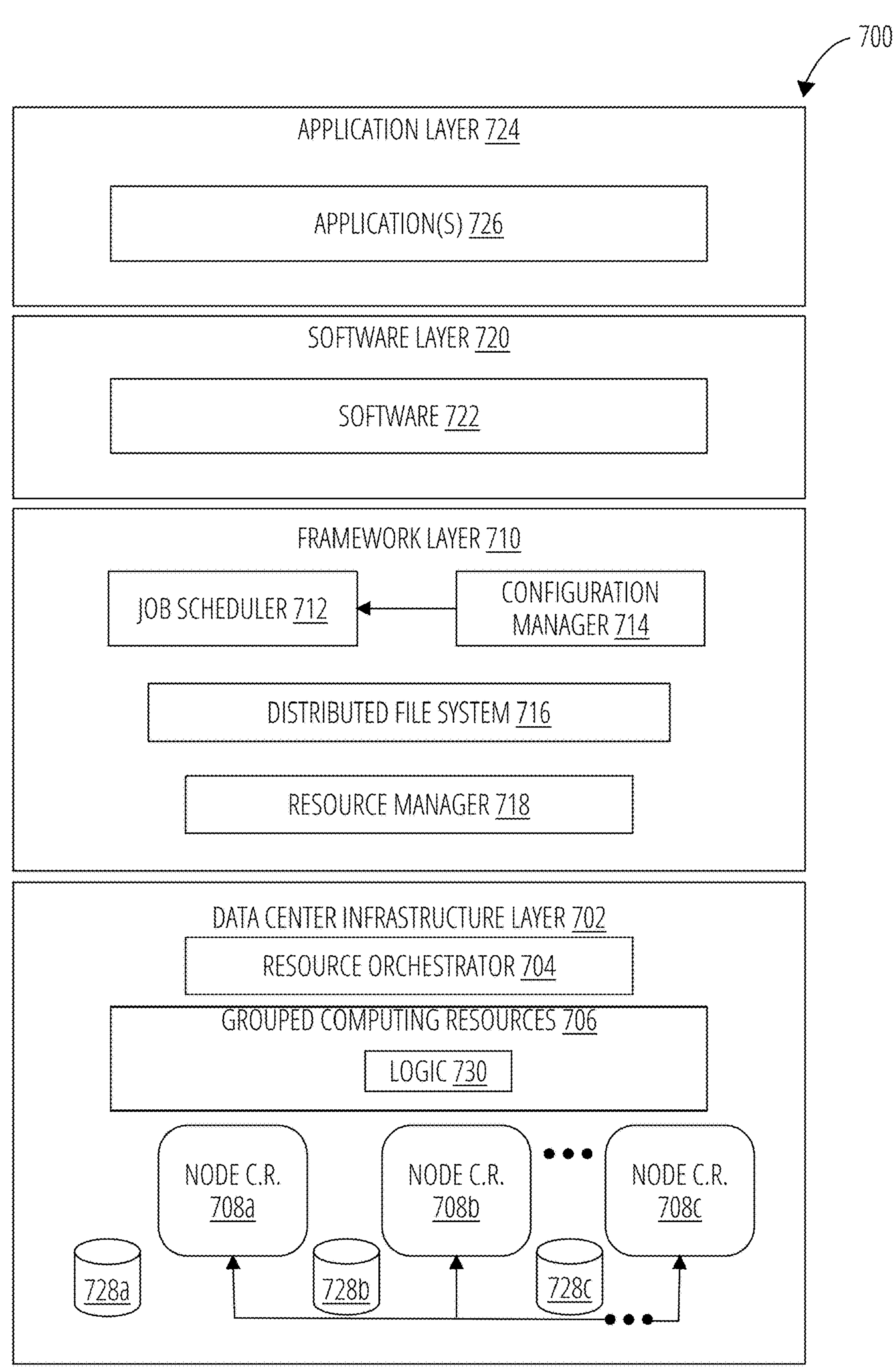
FIG. 7 illustrates an exemplary data center 700, in accordance with at least one embodiment.

FIG. 6 depicts a processing device 602 that includes a central processing unit 608 and two (or more) graphics processing units 604, 606. The processing device 602 may in one embodiment be implemented on a single silicon die (i.e., a 'superchip') and may be utilized, often in large numbers, in a data center. An exemplary data center 700 that may utilize the processing device 602 is depicted in FIG. 7. As depicted in the example embodiment of FIG. 6, the central processing unit 608 may be coupled to the graphics processing units 604, 606 via a die-to-die (D2D) or chip-to-chip (C2C) interconnect such as a Ground-Referenced Signaling interconnect (GRS interconnect). The central processing unit 608 may be coupled to the graphics processing units 604, 606 via PCIe (Peripheral Component Interconnect Express) interconnects. One or more V-F switching circuit 310 may be utilized with the central processing unit 608 and the graphics processing units 604, 606 due to the central processing unit 608 comprising a different V-F switching curve that the graphics processing units 604, 606.

FIG. 7 depicts an exemplary data center 700, in accordance with at least one embodiment. In at least one embodiment, data center 700 includes, without limitation, a data center infrastructure layer 702, a framework layer 710, a software layer 720, and an application layer 724.

In at least one embodiment, as depicted in FIG. 7, data center infrastructure layer 702 may include a resource orchestrator 704, grouped computing resources 706, and node computing resources (node C.R.s) **708*a*, 708*b*, 708*c*, where "N" represents any whole, positive integer. In at least one embodiment, node computing resources may include, but are not limited to, any number of central processing units (CPUs) or other processors (including accelerators, field programmable gate arrays (FPGAs), graphics processors, etc.), memory devices 728*a*, 728*b*, 728*c*** (e.g., dynamic random-access memory, solid state or disk drives, etc.), network input/output (NW I/O) devices, network switches, virtual machines (VMs), power modules, and cooling modules, etc. In at least one embodiment, one or more node computing resources from among node computing resources

708a, 708b, 708c may be a server having one or more of the above-mentioned computing resources.

In at least one embodiment, grouped computing resources 706 may include separate groupings of node computing resources housed within one or more racks (not shown), or many racks housed in data centers at various geographical locations (also not shown). Separate groupings of node computing resources within grouped computing resources 706 may include grouped compute network, memory, or storage resources that may be configured or allocated to support one or more workloads. In at least one embodiment, several node computing resources including CPUs or processors may be grouped within one or more racks to provide compute resources to support one or more workloads. In at least one embodiment, one or more racks may also include any number of power modules, cooling modules, and network switches, in any combination.

In at least one embodiment, resource orchestrator 704 may configure or otherwise control one or more node computing resources 708a, 708b, 708c and/or grouped computing resources 706. In at least one embodiment, resource orchestrator 704 may include a software design infrastructure ("SDI") management entity for data center 700. In at least one embodiment, resource orchestrator 704 may include hardware, software, or some combination thereof.

In at least one embodiment, as depicted in FIG. 7, framework layer 710 includes, without limitation, a job scheduler 712, a configuration manager 714, a resource manager 718, and a distributed file system 716. In at least one embodiment, framework layer 710 may include a framework to support software 722 of software layer 720 and/or one or more application(s) 726 of application layer 220. In at least one embodiment, software 722 or application(s) 726 may respectively include web-based service software or applications, such as those provided by Amazon Web Services, Google Cloud, and Microsoft Azure. In at least one embodiment, framework layer 710 may be, but is not limited to, a type of free and open-source software web application framework such as Apache SPARK™ (hereinafter "Spark) that may utilize a distributed file system 716 for large-scale data processing (e.g., "big data"). In at least one embodiment, job scheduler 712 may include a Spark driver to facilitate scheduling of workloads supported by various layers of data center 700. In at least one embodiment, configuration manager 714 may be capable of configuring different layers such as software layer 720 and framework layer 710, including Spark and distributed file system 716 for supporting large-scale data processing. In at least one embodiment, resource manager 718 may be capable of managing clustered or grouped computing resources mapped to or allocated for support of distributed file system 716 and job scheduler 712. In at least one embodiment, clustered or grouped computing resources may include grouped computing resources 706 at data center infrastructure layer 702. In at least one embodiment, resource manager 718 may coordinate with resource orchestrator 704 to manage these mapped or allocated computing resources.

In at least one embodiment, software 722 included in software layer 720 may include software used by at least portions of node computing resources 708a, 708b, 708c, grouped computing resources 706, and/or distributed file system 716 of framework layer 710. One or more types of software may include, but are not limited to, Internet web page search software, e-mail virus scan software, database software, and streaming video content software.

In at least one embodiment, application(s) 726 included in application layer 724 may include one or more types of applications used by at least portions of node computing resources 708a, 708b, 708c, grouped computing resources 706, and/or distributed file system 716 of framework layer 710. In at least one or more types of applications may include, without limitation, Compute Unified Device Architecture (CUDA) applications, 5G network applications, artificial intelligence applications, data center applications, and/or variations thereof. In at least one embodiment, one or more types of applications may include, but are not limited to, any number of a genomics application, a cognitive compute, application and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 714, resource manager 718, and resource orchestrator 704 may implement any number and type of self-modifying actions based on any amount and type of data acquired in any technically feasible fashion. In at least one embodiment, self-modifying actions may relieve a data center operator of data center 700 from making possibly bad configuration decisions and possibly avoiding underutilized and/or poorly performing portions of a data center.

In at least one embodiment, data center 700 may comprise tools, services, software or other resources to train one or more machine learning models or predict or infer information using one or more machine learning models according to one or more embodiments described herein. For example, in at least one embodiment, a machine learning model may be trained by calculating weight parameters according to a neural network architecture using software and computing resources described above with respect to data center 700. In at least one embodiment, trained machine learning models corresponding to one or more neural networks may be used to infer or predict information using resources described above with respect to data center 700 by using weight parameters calculated through one or more training techniques described herein.

In at least one embodiment, data center 700 may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as image recognition, speech recognition, or other artificial intelligence services.

The grouped computing resources 706 may be configured with logic 730 to implement the application(s) 726. For example, the logic 730 may comprise inference and/or training logic to perform deep learning inferencing and/or training operations associated with one or more embodiments. In at least one embodiment, logic 730 may configure the data center 700 for inferencing or predicting operations based, at least in part, on weight parameters calculated using neural network training operations, neural network functions and/or architectures, or neural network use cases described herein.

LISTING OF DRAWING ELEMENTS

102 thermometer decoder
104 frequency locked loop
106 multiple-input digitally-controlled oscillator
202 minimum selector
302 frequency locked loop

304 thermometer decoder
306 digitally controlled oscillator
308 thermometer decoder
310 V-F switching circuit
402 regulator
602 processing device
604 graphics processing unit
606 graphics processing unit
608 central processing unit
700 data center
702 data center infrastructure layer
704 resource orchestrator
706 grouped computing resources
**708*a*** node computing resource
**708*b*** node computing resource
**708*c*** node computing resource
710 framework layer
712 job scheduler
714 configuration manager
716 distributed file system
718 resource manager
720 software layer
722 software
724 application layer
726 application(s)
**728*a*** memory device
**728*b*** memory device
**728*c*** memory device
730 logic Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). Logic symbols in the drawings should be understood to have their ordinary interpretation in the art in terms of functionality and various structures that may be utilized for their implementation, unless otherwise indicated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

Although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the intended invention as claimed. The scope of inventive subject matter is not limited to the depicted embodiments but is rather set forth in the following Claims.

What is claimed is:

1. A circuit comprising:

a fast-propagation path configured to propagate a first code from a plurality of stages to a digitally controlled oscillator; and a frequency locked loop configured to (a) generate a second code to the digitally controlled oscillator over a slow-propagation path, and (2) disable the fast-propagation path to the digitally controlled oscillator upon the first code satisfying a match with the second code.

2. The circuit of claim 1, wherein the first code comprises a frequency throttle code.

3. The circuit of claim 1, wherein the second code and the first code each comprise complete output settings for the digitally controlled oscillator.

4. The circuit of claim 1, further configured such that the fast-propagation path to the digitally controlled oscillator is disabled upon the frequency locked loop locking on a frequency corresponding to the first code.

5. The circuit of claim 1, wherein the frequency locked loop comprises a regulator configured to determine when the second code satisfies the match with the first code.

6. The circuit of claim 1, wherein:

each stage is configured to receive an enable signal for a respective first code; and the frequency locked loop is configured to revert to generating a default code upon de-assertion of the enable signals to the stages.

7. A system comprising:

a first circuit comprising a first voltage/frequency switching characteristic;

a second circuit comprising a second voltage/frequency switching characteristic;

a voltage/frequency domain switching circuit coupled to the first circuit and to the second circuit, the voltage/frequency domain switching circuit comprising:

a fast-propagation path configured to propagate a throttle code from a plurality of inputs to a digitally controlled oscillator; and a frequency locked loop configured to (a) generate a code to the digitally controlled oscillator over a slow-propagation path, and (2) disable the fast-propagation path to the digitally controlled oscillator upon the code satisfying a match with the throttle code.

8. The system of claim 7, wherein the first circuit is a central processing unit and the second circuit is a graphics processing unit.

9. The system of claim 7, wherein the throttle code and the code each comprise complete output settings for the digitally controlled oscillator.

10. The system of claim 7, further configured such that the fast-propagation path to the digitally controlled oscillator is disabled upon the frequency locked loop locking on a frequency corresponding to the throttle code.

11. The system of claim 7, wherein the frequency locked loop comprises a regulator configured to determine when the code generated by the frequency locked loop satisfies the match with the throttle code.

12. The system of claim 7, wherein:

each input is configured to receive an enable signal for a respective throttle code; and the frequency locked loop is configured to revert to generating a default code upon de-assertion of the enable signals to the inputs.

13. A data center comprising:

a central processing unit comprising a first voltage/frequency switching characteristic;

a graphics processing unit comprising a second voltage/frequency switching characteristic;

a voltage/frequency domain switching circuit coupled to the central processing unit and to the graphics processing unit, the voltage/frequency domain switching circuit comprising:

a fast-propagation path configured to propagate a plurality of first codes to a digitally controlled oscillator; and a frequency locked loop configured to (a) generate a second code to the digitally controlled oscillator over a slow-propagation path, and (2) disable the fast-propagation path to the digitally controlled oscillator upon the second code satisfying a match with one of the first codes.

14. The data center of claim 13, wherein the first codes are different frequency throttle codes.

15. The data center of claim 13, wherein the first processor is a central processing unit and the second processor is a graphics processing unit.

16. The data center of claim 13, wherein the first codes and the second code each comprise complete output settings for the digitally controlled oscillator.

17. The data center of claim 13, further configured such that the fast-propagation path to the digitally controlled oscillator is disabled upon the frequency locked loop locking on a frequency corresponding to one of the first codes.

18. The data center of claim 13, wherein the frequency locked loop comprises a regulator configured to determine when the second code generated by the frequency locked loop satisfies the match with one of the first codes.

19. The data center of claim 13, wherein:

each input is configured to receive an enable signal for a respective first code; and the frequency locked loop is configured to revert to generating a default code upon de-assertion of the enable signals to the inputs.

20. A supply voltage control process comprising:

transmitting, over a fast-propagation path, frequency throttle codes from a plurality of input stages to a digitally controlled oscillator; and operating a frequency locked loop to (a) generate a control code to the digitally controlled oscillator over a slow-propagation path, and (2) disable the fast-propagation path to the digitally controlled oscillator upon one of the frequency throttle codes satisfying a match with the control code.

* * * * *